United States Patent [19]

Sawyer, Jr. et al.

[11] Patent Number: 4,987,443
[45] Date of Patent: Jan. 22, 1991

[54] METHOD AND APPARATUS FOR IMAGING PRESS PLATES

[76] Inventors: Sterling S. Sawyer, Jr., 4293 Slash Pine La., Tallahassee, Fla. 32304; Myron A. Sawyer, P.O. Box 151, Burnt Hills, N.Y. 12027

[21] Appl. No.: 506,118

[22] Filed: Apr. 3, 1990

[51] Int. Cl.$^5$ ............................................. G03B 27/04
[52] U.S. Cl. ...................................... 355/85; 355/86; 355/88
[58] Field of Search ........................... 355/85, 86, 88

[56] References Cited

U.S. PATENT DOCUMENTS

| | | | |
|---|---|---|---|
| 3,520,606 | 7/1970 | Gush et al. | 355/85 |
| 3,794,486 | 2/1974 | Luther | 355/85 |

Primary Examiner—Monroe H. Hayes
Attorney, Agent, or Firm—Dowell & Dowell

[57] ABSTRACT

A method and apparatus for forming and imaging press plates whereby the image is exposed on the press plate under conditions which duplicate the manner in which the plate will be mounted to a specific press cylinder so as to insure alignment of the image with the rotational axis of the cylinder and wherein the apparatus includes an exposure device including a platen having a forward beveled end to which is engaged the forward bent end of a preformed press plate and which also includes rear tensioning pins which are engageable through preformed holes formed in the trailing edge of the press plate. The apparatus further includes a pair of reference pins to which a stripped film is mounted with the reference pins being relatively adjustable so as to alter the alignment of the pins so that an angular adjustment of the image of the film may be made with respect to the forward bent end of the press plate to compensate for any deviation in alignment in a given press cylinder between the press plate receiving slot and the rotational axis of the cylinder.

10 Claims, 3 Drawing Sheets

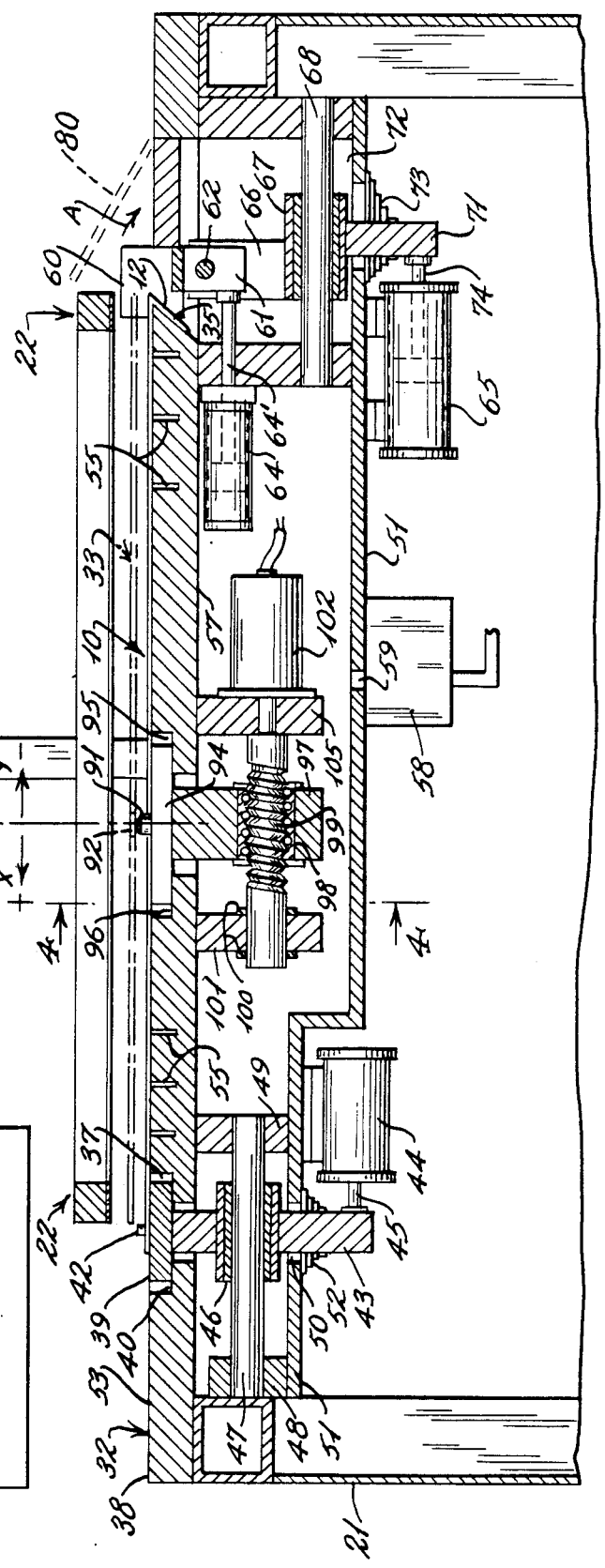
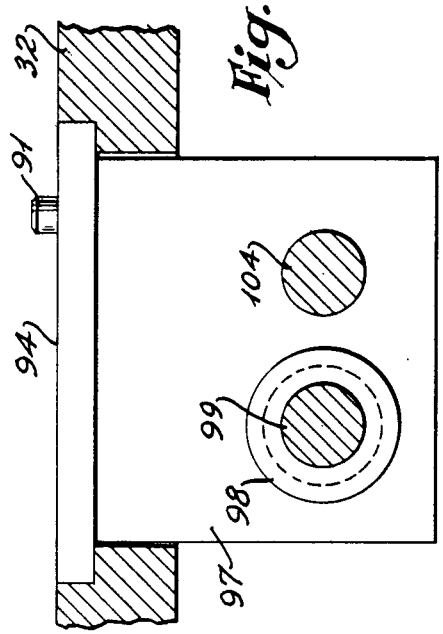

METHOD AND APPARATUS FOR IMAGING PRESS PLATES

BACKGROUND OF THE INVENTION

1. Field of the Invention

This invention relates to a method and apparatus for forming and imaging press plates of the type which are mounted to the cylinders of a printing press and more specifically to a method and apparatus for accurately aligning the exposed image on the press plate relative to the inside leading edge bend of the plate in such a manner that the image will be properly aligned relative to the rotational axis of a specific press cylinder to which the plate will be mounted. In the present invention the press plate is initially formed having a forward or leading bent edge and is provided with punched holes along the opposite or trailing edge. The bent forward edge is formed so as to be cooperatively seated in the front end plate receiving slot of a press cylinder. The preformed plate is placed on a platen of an exposure machine and placed under proper tension and secured by a vacuum to the platen. A film to be exposed to the plate is placed over the plate and is thereafter aligned relative to the forward leading bent edge of the press plate by a pair of relatively adjustable reference pins. The purpose of the pins is to insure that the image to be exposed on the plate is angularly with the inside leading edge bend aligned to compensate for any deviation which may exist between the proper orientation of the front end plate receiving slot of a press cylinder and the rotational axis of the cylinder.

2. History of the Related Art

In printing presses such as commercial web presses, each printing cylinder is structured so that press plates may be selectively mounted to the cylinders. The press plates carry the image which is to be printed The cylinders are generally provided with at least one first slot for receiving the bent front edge of a press plate and at least one second slot which receives the trailing edge of the same press plate. Generally, a tensioning roll or other device is provided in the second slot so that the press plates are properly tensioned against the surface of the printing cylinders.

In order to insure proper alignment of the image carried by a press plate with respect to the rotational axis of a printing cylinder, the slot formed in each cylinder for receipt of the leading bent edge of the press plate is milled so as to be parallel with respect to the rotational axis of the cylinder. The current state of the art assumes that in the manufacturing process the slots in all of the printing cylinders of a given press are machined parallel to the rotational axis of each cylinder and that all of the cylinders of a press are properly and precisely aligned with respect to one another and remain so during the operation of the press. This, however, is not always the case.

On large presses with multiple plates across the printing cylinder and multiple plates around the cylinder, the positioning of individual press plates becomes very precise. It is inparitive that the plates which are individually mounted on one printing cylinder align with the plates on second and third cylinders respectively. For example, in the case where a four color layout is anticipated, there could be a total of 16 plates which on four cylinders each of which has to be mounted in absolute register with the other plates or the resultant printed image will not be satisfactory.

To further insure that the image on the printing cylinder is properly oriented with respect to the rotational axis of a cylinder, extreme care must be taken in preparing the press plates which are mounted to the printing cylinders. Conventionally, these plates are formed by aligning the plate in a punch device wherein holes are punched along one edge of the plate for purposes of receiving alignment or register pins. A stripping sheet with the imposed film having corresponding holes is then placed in position over the plate and a vacuum applied so as to bring the film into contact with the plate. Thereafter the plate is exposed by ultraviolet light. Once the plate has been exposed and treated, the plate is prepared for mounting to a printing cylinder. The plate is placed into a bending machine where the leading edge of the plate is bent so as to conform to the front end receiving slot of a printing cylinder.

From the foregoing procedure, it is necessary that each of the pin registers, the punched holes in the plates and in the strip film all be accurate so as to insure proper image alignment on the printing cylinder. In addition, the bending of the press plate must be accurate. Therefore, several different alignment operations must be manually completed without misaligning the images with respect to the plates. The tolerance in alignment of the image with respect to the inside leading edge bend of the plate must be in the range of approximately 1/1,000 of an inch in order to provide acceptable printing.

Due to the number of aligning operations and the bending of the press plate after it has been exposed, the current procedures for preparing the press plates often lead to possible alignment errors of the final image with respect to the press plate. To compensate for this, many commercial presses install cylinder cocking devices which allow for correction of any angular deviation of the plate image in relation to the leading or front edge slot formed in the printing cylinder. The cocking devices adjust the positioning of the printing cylinder itself as opposed to adjusting the positioning of the plate with respect to the cylinder. Unfortunately, many presses such as open web or non-heat set presses are not equipped with cylinder cocking devices and therefore if the image on a plate is out of alignment, the total plate must be re-made or the plate would have to be shimmed. By shimming, a plate is not properly seated with respect to a cylinder. When a plate is not seated properly with respect to the cylinders, the plates may work loose resulting in a position change of the image or a breaking or failure of the plate.

In presses which do incorporate cocking devices, the use of such devices places excessive wear on bearings, cylinder journals, gears and the like. In a printing press, the elements associated with the printing cylinders are manufacturing with tolerances up to the order of a few 0.0001 inch. Therefore, any wear on the bearings or journals can result in an out of alignment image. Further, the pressure exerted on the cylinders by the cocking devices changes the transfer pressure along the nip between the plate and the blanket cylinders which are engaged with the surface of the plates as the printing cylinders are rotated. This can cause deterioration in print quality.

Some of examples of prior art methods and apparatus for preparing printing plates are disclosed in U.S. Pat.

No. 3,288,063 to Bungay, Jr., U.S. Pat. No. 3,771,440 to Eburn, Jr. and U.S. Pat. No. 4,529,303 to Ternes.

SUMMARY OF THE INVENTION

This invention is directed to a method and apparatus for insuring proper imaging of press plates utilized on the printing cylinders of printing presses. In the method of the invention, the press plates are initially formed to provide a bent leading edge which is of a configuration to be cooperatively seated within the leading or front end slots formed in the printing cylinders. Thereafter, the plates are punched along their trailing edge for purposes of providing holes which will be aligned with tensioning pins provided on an exposure platen. Once the plates have been formed, they are placed on a platen having a forward beveled end portion having the same angular configuration as the front end slots formed in the printing cylinder. The trailing edge of the plates is engaged by the tensioning pins which extend through the punched holes. Thereafter, a stripped film to be exposed to the plate is placed over the plate and is registered with a pair of relatively adjustable alignment or reference pins which are provided intermediate the leading edge and rear edge of the platen. At least one of the reference pins is adjustable so that the alignment between the pins may be angularly varied with respect to the beveled front edge of the platen. The film is thereafter angularly adjusted relative to the surface of the platen by an angular deviation which is determined for a specific printing cylinder so that the image is exposed to the plate in the same angular configuration that the image will have to have relative to the rotational axis of the cylinder to insure a proper printing of the image when the plate is installed on the printing cylinder.

The apparatus of the invention includes an exposure machine which includes a platen having a forward beveled edge which is engaged by the bent leading edge of a press plate and rear adjustable tensioning pins which extend through the punched holes in the press plate. The positioning and tensioning pins are thereafter adjusted so as to place tension on the press plate in an amount which correspondence to the tension which will be applied to the plate when it is mounted to a printing cylinder. A pair alignment or reference pins are mounted to the platen with at least one of the pins being carried by an adjustable slide which is activated by a stepping motor so that the adjustable pin may be moved as a micrometer so as to slightly adjust the line between the pins with respect to the front beveled edge of the platen. When the pins are at their zero setting they will be in parallel relationship to the beveled front edge of the platen. By activation of the moveable pin, the film which is to be exposed to a press plate may be slightly angularly adjusted relative to the leading edge of the press plate. Thereafter, a vacuum device is activated to secure the press plate with respect to the platen after which an exposure light is adjusted vertically with respect to the film and activated to expose the film to the plate.

It is the primary object of the present invention to provide a method and apparatus for imaging press plates for printing presses which insures that the image exposed to the plate is in proper angular relation with respect to the inside leading edge bend of the press plate so that when the plate is mounted to a printing cylinder, the image will be aligned parallel with the axis of rotation of the cylinder.

It is a further object of the present invention to provide a micrometer adjustment of reference pins to provide an angular adjustment or realignment of the film with respect to the press plate so as to compensate for inherent cylinder press misalignments.

It is a further object of the present invention to provide a method for eliminating the need to provide presses with cocking devices and thereby reduce wear and tear on the components of printing presses wherein the press plates are initially formed to include a leading edge bend which is necessary for mounting the plates to printing cylinders and thereafter imaging the plates so that the images will be exposed to the plates at an angle which will compensate for any deviation between the true parallel alignment of the front end slot of the printing cylinders and the axis of rotation of the printing cylinders.

It is also an object of the present invention to provide a method and apparatus for imaging press plates for printing presses wherein the deviation of a given printing cylinder may be determined and thereafter each press plate which is prepared for a given cylinder may be imaged by allowing for the deviation during the time when the plate is exposed without having to make further adjustment to the printing cylinder after the press plates have been mounted thereto.

BRIEF DESCRIPTION OF THE DRAWINGS

FIG. 3 is an enlarged cross sectional view taken along lines 3—3 of FIG. 1.

FIG. 4 is an enlarged cross sectional view taken along lines 4—4 of FIG. 3.

DESCRIPTION OF THE PREFERRED EMBODIMENT

Figure 5:
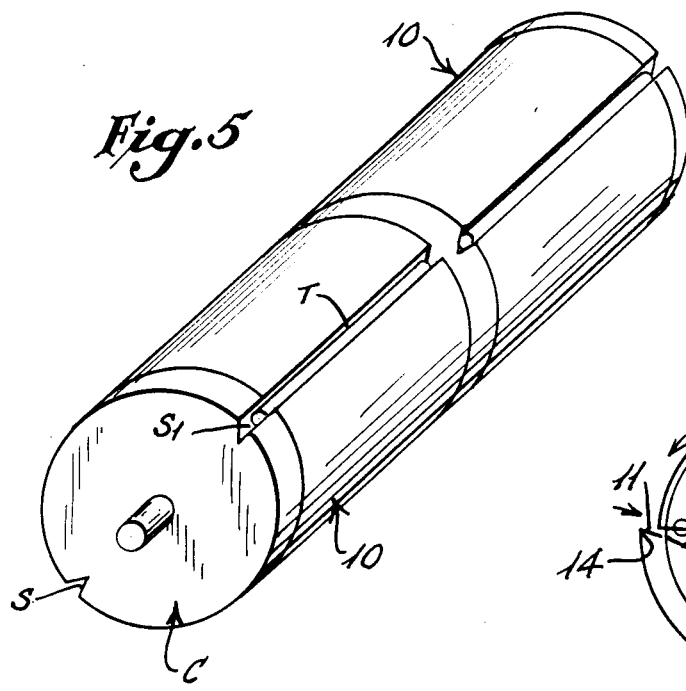
FIG. 5 is a perspective view of a conventional printing press cylinder having four press plates mounted thereto.
Figure 6:
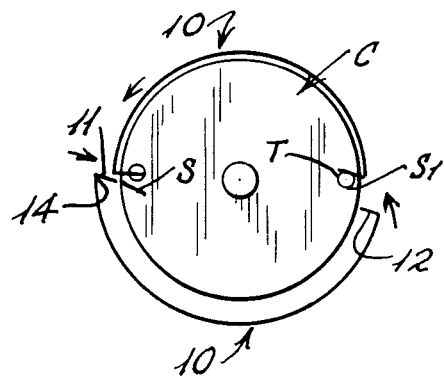
FIG. 6 is a cross sectional illustrational view of the printing cylinder of FIG. 5 showing the installation of two of the press plates to the cyclinder.

With continued reference to the drawings, the present invention is directed to a method and apparatus for insuring that the image which is transferred to a press plate 10 is properly aligned with the plate so that when the plate is installed or mounted to a printing press cylinder C, the image carried by the press plate will be in true parallel alignment with respect to the axis of rotation of the cylinder. With particular reference to FIGS. 5 and 6, an arrangement is shown wherein multiple press plates are mounted to a single printing cylinder. Each printing cylinder includes a pair of milled front end receiving slots S into which the bent or leading edge 11 of the press plates are selectively received. The cylinder is also provided with a pair of additional slots S1 into which the bent tail end portions 11 of the cylinder plates are selectively inserted. In each slot S1 there are provided rotatable tensioning elements T which engage within openings 12 which are punched in the trailing end portion 13 of each press plate. In this manner, each press plate is tensioned by rotation of the tensioning elements to thereby tightly engage the leading or bent edge portion 11 of each plate into tightly seated and fitted engagement within the slots S. At this point in time, the inner leading surface of the bent portion 11 which is shown at 14 in the drawings, is at the same position as the outermost edge of the slot S so that the two extend along a common line. It therefore follows that if the image on the press plate is parallel with respect to the common line indicative of the alignment between the inside of the leading edge 14 and the outer edge of the slot S then the image will be parallel with respect to the axis of rotation of the cylinder.

Utilizing the method and apparatus of the present invention, it is possible to consistently insure that the image formed on the press plate will be parallel with the leading inner edge of the bent portion of the press plate for every given cylinder regardless of any misalignment in the parallel relationship between the front end receiving slots S and the axis of the cylinder or any wear with respect to the front end slots which would cause the slots to be slightly out of parallel relationship with regard to the axis of rotation. With the present invention, the press plate 10 is initially bent by a conventional press plate bending apparatus (not shown) so as to form the bent leading edge 11 while the press plate is still in a generally flat configuration as shown in dotted line in FIG. 1. Thereafter, a plurality of positioning and tensioning holes 12 are punched through the trailing edge portion of the plate. With the pre-shaping and punching treatment completed, the plate is now ready to be received within the exposure apparatus of the present invention.

Figure 1:
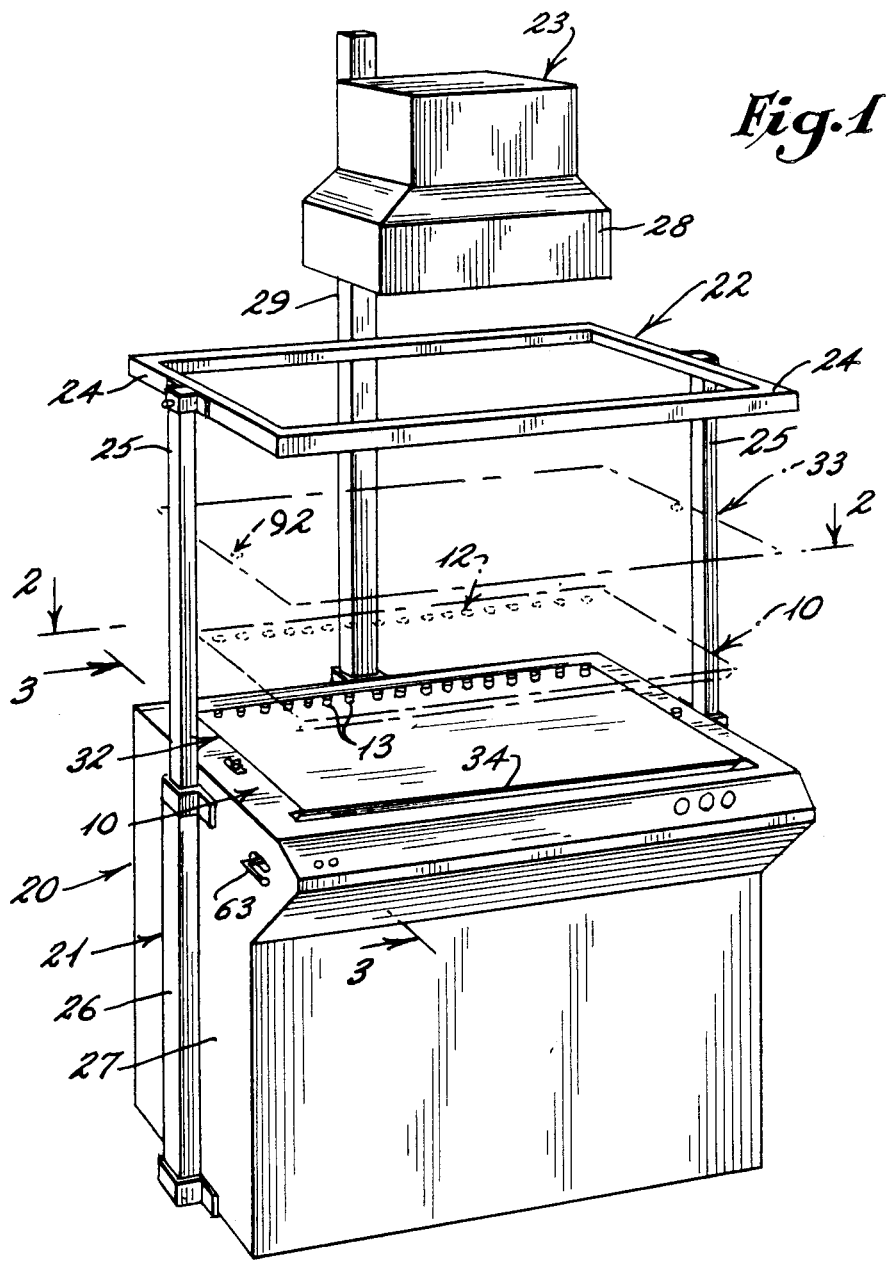
FIG. 1 is s a perspective illustrational view of the press plate exposure machine of the present invention showing, in dotted line, a press plate which has been preformed for selective placement on the exposure platen of the machine and showing also, in dotted line, the film which is to overlay the press plate in preparation for exposing the image of the film to the press plate.

With particular reference to FIG. 1, the exposure apparatus 20 includes a base assembly 21, a generally rectangular clamping frame assembly 22 and an exposure ultraviolet light source 23. The end portions 24 of the clamping frame 22 are mounted to the upper ends of a pair of spaced vertically telescoping support posts 25 which are selectively receivable and adjustable relative to outer support housings 26 mounted adjacent the opposite sides 27 of the base 21. Each of the vertically extending telescoping support posts 25 may be manually adjustable or they may be mechanically adjustable such as by providing appropriate pneumatic cylinders within each of the housings 26.

The exposure light source 23 is also vertically adjustable with respect to the base 21 and includes a light hood 28 which is mounted to a vertical support post 29 that extends down to a support housing 30 secured to the rear wall of the base 21.

The upper surface of the base 21 defines an exposure platen 32 on which the press plate 10 and film 33 are selectively mounted. An elongated slot 34 is provided along the front portion of the platen 32 so as to define a front tapering edge 35 which extends downwardly and rearwardly with respect to the platen at the same angle that the slots S in the pressed cylinder C are made so that the bent forward or leading edge portion of a press plate may be cooperatively seated therewith as is shown in FIG. 3.

With particular reference to FIG. 3, the exposure platen 32 also includes a generally T-shaped elongated slot 37 in the rear portion 38 thereof which extends generally parallel with respect to the leading edge or beveled wall portion 35. An adjustment block 39 is seated within the upper portion of the T-shaped opening 37 so as to rest against the intermediate horizontal support walls 40 defined by the slot. A plurality of tensioning pins 42 are mounted to the block 39 so as to extend generally parallel with respect to the front edge 35 of the platen. The tensioning pins 42 are receivable within the punched openings or apertures 12 which are formed in the press plates 10.

In order to adjust the spacing between the tensioning pins 42 and the leading edge 35 of the platen, the adjustment block 39 is carried by a guide assembly 43 which is actuated through a pneumatic cylinder 44 by way of cylinder extension rod 45. The guide assembly 43 includes an inner cylindrical guide sleeve 46 that is slideable along a horizontally oriented guide rail 47 mounted in end bearings 48 and 49. The lower portion of the control assembly 43 extends through an opening 50 provided in a lower plate or wall 51 which plate is provided for purposes of enclosing the space spaced immediately below the platen so that an appropriate vacuum may be applied in the space as will be discussed in greater detail hereinafter. In order to seal the opening 50 an elastic boot 52 is provided which surrounds the lower portion of the control mechanism and covers the opening 50.

From the foregoing, once a press plate is placed upon the platen with the forward leading edge of the press plate engaging the forward or front wall 35 of the platen, and with the openings in the press plate being engaged by the pins 42 of the platen, appropriate operation of pneumatic cylinder 44 will cause the pins to be moved away from the forward leading edge portion 35 of the platen while maintaining the trailing edge of the press plate in generally parallel relationship with respect to the leading or bent forward edge portion thereof. It is desired that the amount of tension provided on the press plate be equal to the amount of tension which will be applied to the press plate when it is placed on a printing press cylinder so that proper imaging of the plate may be obtained. The amount of tension may be controlled by a suitable control means (not shown).

Once the press plate is tensioned, the platen is drawn into tightly seated and flat relationship with upper surface 53 of the platen by applying a vacuum to the undersurface of the press plate through a plurality of openings 55 which extend through the platen and communicate with the enclosed space 56 immediately below the lower surface 57 of the platen. The vacuum is applied by a suitable vacuum pump 58 which communicates through an opening 59 into the enclosed space 56.

The forward leading edge portion of the press plate is initially seated against the platen and prevented from accidental shifting prior to tensioning through the use of the tensioning pins 42 by providing an elongated clamping pad 60 which is preferably made of a TEFLON-like material which will prevent any marring of the treated surface of the press plate. The clamp includes a generally V-shaped slot which is cooperatively designed and configured to assume the same angular relationship as the tapered front wall 35 of the platen. The clamp 60 is mounted on a pivot arm 61 which pivots with pivotable shaft 62 which is manually operated by a handle 63 which extends outside of the base assembly as is shown in FIG. 1. The operation of the handle 63 will pivot the clamp 60 forward or away from an aligned position with respect to the leading edge 35 of the platen. Horizontal adjustment of the clamp 60 to bring the pad into contact with the press plate, as shown in FIG. 3, however, is accomplished through a first pneumatic cylinder 65 which is connected through a guide assembly 66 to the pivot shaft 62. The guide assembly 66 includes a cylindrical bearing 67 which slides and is guided along a guide rail 68 mounted at either end in bearing walls 69 and 70. The lower portion 71 of the guide assembly 66 extends through an opening 72 in the lower wall 51 which defines the enclosed vacuum area 56. To seal the opening 72, a flexible boot 73 is mounted across the opening and is seated about the lower portion 71 of the guide element.

Once the pad 60 is engaged with the bent forward end of the press plate as shown in FIG. 3, a second pneumatic cylinder 64 is activated to pivot the pad tightly against the forward end of the press plate. The pneumatic cylinder 64 includes a cylinder rod 64' which is mounted below the shaft 62 so that by activation of the rod, the pad 60 will be urged downwardly against the bent forward end of the press plate. Thereafter, the press plate is ready for tensioning.

Once the press plate has been subjected to proper tensioning by the tension pins 42 and placed under vacuum, the clamp 60 is moved away from the leading edge 35 of the plate by operation of the pneumatic cylinders 64 and 65 which shift the clamp away from the press plate and thereafter the clamp is pivoted away from the leading edge and beneath the surface of the platen as indicated by the movement shown by arrow A by operation of handle 63. To seal the elongated channel formed by the opening in the platen so as to maintain a proper vacuum within the vacuum space 56, an elongated vacuum flap 80 is selectively pivotable across the opening so as to engage with the upper edge portion of the press plate seated on the platen. The flap 80 may be selectively operated either mechanically or manually.

As was previously discussed, each printing cylinder has its own physical deviations with respect to the true parallel alignment between the outer leading edge of the slots S and the axis of rotation of the cylinder. Due to this non-true alignment, the exposure of the film 33 to the press plate must be made in such a manner as to compensate for the degree of non-parallel alignment between a given slot S and the axis of rotation of a specific cylinder. Once this deviation has been determined, the apparatus of the present invention may be utilized to compensate for that deviation so that the image which will be exposed on the press plate will be at the same degree of angular deviation so that when the press plate is mounted to the press cylinder a true parallel alignment will be obtained between the image and the axis of rotation of the cylinder.

Figure 2:
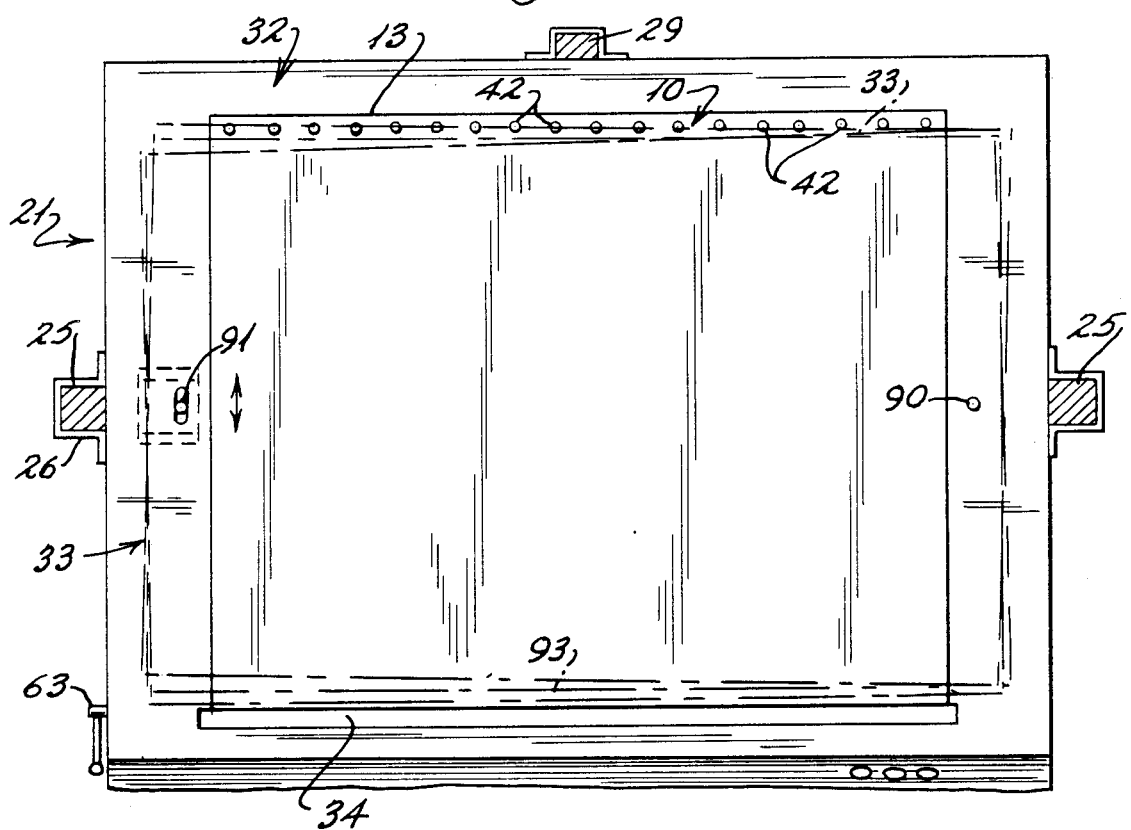
FIG. 2 is a cross section taken along lines 2—2 of FIG. 1 that reflects a top plan view of the platen of the exposure machine showing in dotted line the angular adjustment of one of the reference pins whereby the film may be angularly adjusted with respect to a press plate which has been secured to the platen.

In order to provide for slight angular deviation of the film with respect to the press plate, the present apparatus includes a pair of position or registry pins 90 and 91 which are mounted along opposite sides of the upper surface of the platen so as to be spaced outwardly with respect to the side edges of the press plate. The pins are relatively adjustable with respect to one another and act as a micrometer for varying the position or angular relationship of the film with respect to the press plate. In the embodiment shown, the positioning pin 91 is adjustably mounted with respect to the platen so that the position of the pin may be altered in increments of up to 1/10,000 of an inch with respect to the front leading edge 35 thereof. When the pin 91 is in a zero position, the line between it and pin 90 is parallel with respect to the leading edge portion 35 of the platen. Should there be a deviation in the parallel alignment between the edge of a slot S of a printing cylinder and its axis of rotation, the same deviation may be accounted for by moving the pin 91 either forwardly or rearwardly with respect to the leading edge 35 of the platen. As is illustrated in FIG. 2, the film 33 which is positioned over the press plate includes a pair of openings 92 which are in horizontal alignment with respect to the leading edge 93 of the film. These openings are positioned over the pins 90 and 91 thereby allowing the movement of pin 91 to alter the angular relationship of the film which is to be exposed to the press plate.

With specific reference to FIGS. 3 and 4, the details of the adjusting mechanism for pin 91 are disclosed in greater detail. Pin 91 is carried by a support plate 94 which is seated in a T-shaped opening 95 so as to be against the intermediate wall 96 of the opening. The plate 94 is mounted to an adjusting block 97 which has a ball and nut assembly 98 mounted therethrough through which extends a lead screw 99. The lead screw has its outer end mounted in thrust bearings 100 carried by a depending flange 101. The opposite end of the lead screw is connected to a stepper motor 102 which is suitably connected to a control panel of the exposure machine. The block 97 is further guided by a fixed guide rail 104 which also extends between flange 101 and flange 105. The pin 91 may be moved either in the X or Y direction as shown in FIG. 3.

Once the film is properly angularly adjusted with respect to the press plate, the clamping frame 22 is applied over the outer edges of the film to retain the film in place and thereafter the exposure light is properly vertically adjusted and the film exposed to the press plate. The press plate is thereafter treated to develop the proper image.

Once the press plate has been removed from the platen, it may be placed on the specific printing cylinder with the image exposed on the plate being at a proper angular relationship to the inside leading bent edge to thereby insure that the image will be parallel to the axis of rotation of the cylinder during the printing process. Although not shown in the drawings, it is possible to provide a similar adjustment mechanism for reference pin 90 so that the adjustment may be made to the angular alignment of the film along either side of the press plate.

Utilizing the invention, it is possible to determine for each printing cylinder the standard deviation of the angular difference between a desired parallel arrangement of the leading edge of the slot S and the axis of rotation of the cylinder. That information is maintained in a computerized control circuit associated with the exposure machine of the present invention. At each time a new press plate is needed for a given cylinder, the computer may be accessed and the adjustment assembly for positioning pin 91 automatically activated to shift the film angularly with respect to the leading edge of the platen to thereby insure proper alignment of the exposed image for the selected printing cylinder.

We claim:

1. A method of imaging press plates for use with the cylinders of a printing press and wherein the printing cylinders have a first slot therein for receiving the leading edge of the press plate and a second slot therein for receiving the trailing edge of the press plate and wherein the press plates are exposed while on an exposure platen having a front beveled end comprising the steps of:
(a) bending the leading edge of the press plate so as to form a bent front edge which may be cooperatively receivable within the first slot of the cyclinder;
(b) placing the press plate on the exposure platen so that said bent front edge is engaged with the front beveled end of the exposure platen;
(c) retaining the press plate so that the bent leading edge is in a first orientation against the front beveled end of the exposure platen;
(d) placing a film to be exposed to the press plate over the press plate;
(e) angularly aligning the film with respect to said first orientation of the bent front edge of the press plate;
(f) and thereafter exposing the film to the press plate.

2. The method of claim 1 including the additional steps of punching holes in the trailing edge of the press plate prior to placing the press plate on the exposure platen and tensioning the press plate prior to retaining the press plate on the exposure platen.

3. The method of claim 2 in which the press plate is retained on the press platen in said first orientation by application of a vacuum through the exposure platen.

4. An apparatus for imaging press plates of the type having a leading edge which is receivable in a first slot of a printing press cylinder and a trailing edge which is receivable in a second slot in the press cylinder comprising, a light source and an exposure platen, means for mounting said light source in spaced relationship with respect to said platen, said platen having forward, side and rear portions, a tapered front edge being defined along said forward portion, tension pin means mounted along said rear portion of said platen, a pair of reference pins disposed along each side of said platen, adjustment means connected to at least one of said reference pin means for selectively adjusting the line of alignment between said reference pins from a line parallel with respect to said front edge to a line oriented angularly offset with respect to said front edge.

5. The apparatus of claim 4 including a second adjustment means, means for connecting said second adjustment means to said tension pin means, said second adjustment means being moveable toward and away from said front edge of said platen.

6. The apparatus of claim 5 including an elongated clamping member mounted adjacent said front edge of said platen, and means for moving said clamping member relative to said front edge so as to clamp the leading edge of the press plate to said front edge of said platen.

7. The apparatus of claim 6 in which said clamping member includes an elongated recess defined by upper and lower wall portions, said upper and lower wall portions extending inwardly of said front edge when said clamping member is brought into close proximity to said front edge of said platen.

8. The apparatus of claim 5 wherein said platen includes a plurality of openings therethrough and vacuum means for applying a vacuum through said opening so as to retain a press plate position on said platen.

9. The apparatus of claim 8 in which said first adjustment means for adjusting said at least one reference pin means includes a micrometer means whereby adjustments of as little as 1/10,000 of an inch may be made relative to the spacing between said adjustable pin means and said front edge of said platen.

10. The apparatus of claim 4 in which said first adjustment means for adjusting said at least one reference pin means includes a micrometer means whereby adjustments as little as 1/10,000 of an inch may be made relative to the spacing between said adjustable pin means and said front edge of said platen.

* * * * *